United States Patent
Ho et al.

(10) Patent No.: US 10,192,837 B1
(45) Date of Patent: Jan. 29, 2019

(54) MULTI-VIA REDISTRIBUTION LAYER FOR INTEGRATED CIRCUITS HAVING SOLDER BALLS

(71) Applicant: NXP B.V., Eindhoven (NL)

(72) Inventors: Chung Hsiung Ho, Kaohsiung (TW);
Wayne Hsiao, Kaohsiung (TW);
Richard Te Gan, Chandler, AZ (US);
James Raymond Spehar, Chandler, AZ (US)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/849,656

(22) Filed: Dec. 20, 2017

(51) Int. Cl.
*H01L 23/00* (2006.01)

(52) U.S. Cl.
CPC .............. *H01L 24/02* (2013.01); *H01L 24/13* (2013.01); *H01L 24/94* (2013.01); *H01L 2224/02311* (2013.01); *H01L 2224/02331* (2013.01); *H01L 2224/02381* (2013.01); *H01L 2224/10126* (2013.01); *H01L 2224/13014* (2013.01); *H01L 2224/13024* (2013.01); *H01L 2924/01029* (2013.01); *H01L 2924/07025* (2013.01); *H01L 2924/3511* (2013.01); *H01L 2924/3512* (2013.01)

(58) Field of Classification Search
CPC .......... H01L 24/02; H01L 24/13; H01L 24/94
See application file for complete search history.

(56) References Cited

U.S. PATENT DOCUMENTS

| 5,923,088 | A | 7/1999 | Shiue et al. |
| 7,977,789 | B2 * | 7/2011 | Park ................. H01L 24/03 257/737 |
| 9,281,286 | B1 | 3/2016 | Yap et al. |
| 2005/0014356 | A1 | 1/2005 | Pozder et al. |
| 2009/0152727 | A1 | 6/2009 | Kim |

* cited by examiner

*Primary Examiner* — William Coleman
(74) *Attorney, Agent, or Firm* — Charles E. Bergere

(57) ABSTRACT

A wafer-level chip-scale package (WLCSP) includes an integrated circuit (IC) chip, and die bonding pads with a redistribution layer (RDL) having multiple via structures located directly below the footprint of a solder ball placed on the bonding pad. The via structures electrically connect the solder ball to a top metal layer of the IC chip. The RDL may extend beyond the solder ball's footprint and have additional vias that connect to the top metal layer, including vias located under and connected to other solder balls. The bonding pads have a low R-on resistance and are not susceptible to thermal-induced cracking.

16 Claims, 12 Drawing Sheets

100

150

200

250

200

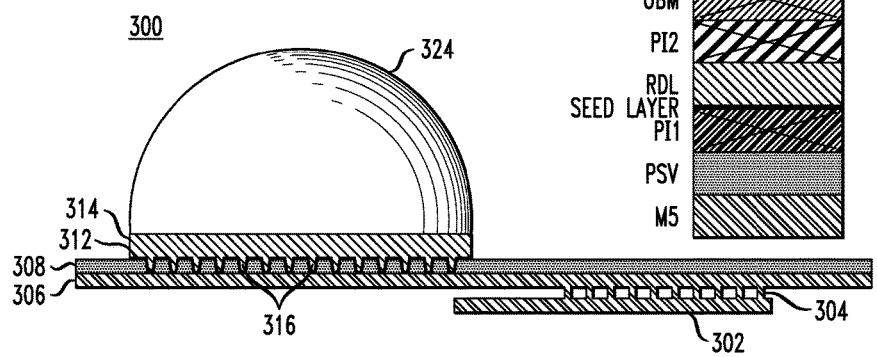
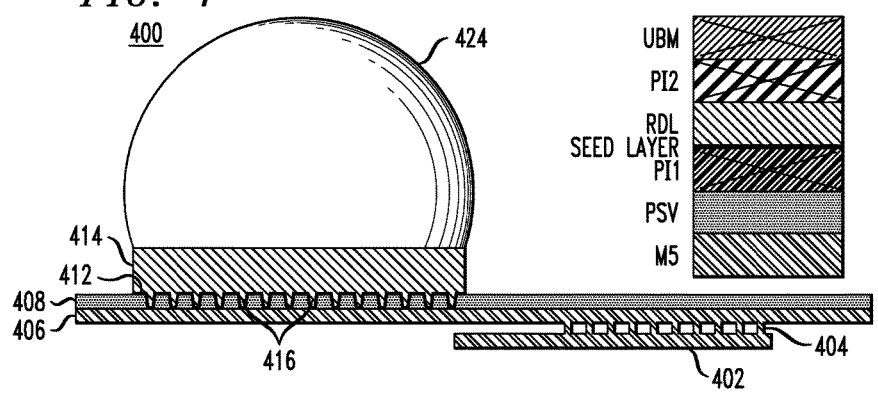
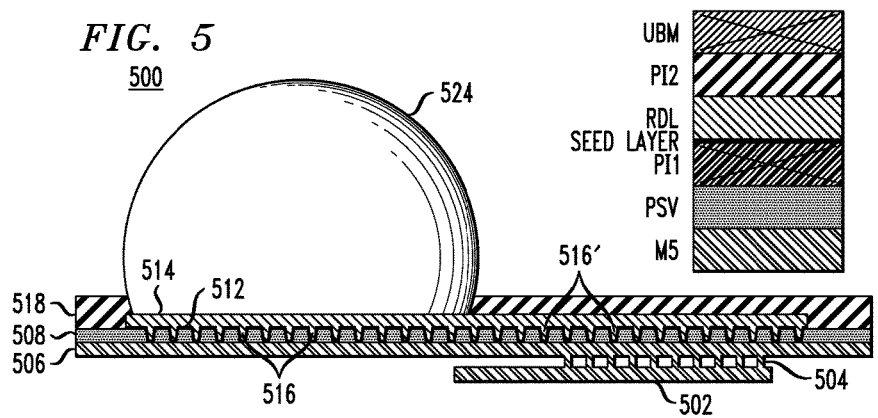

600

600

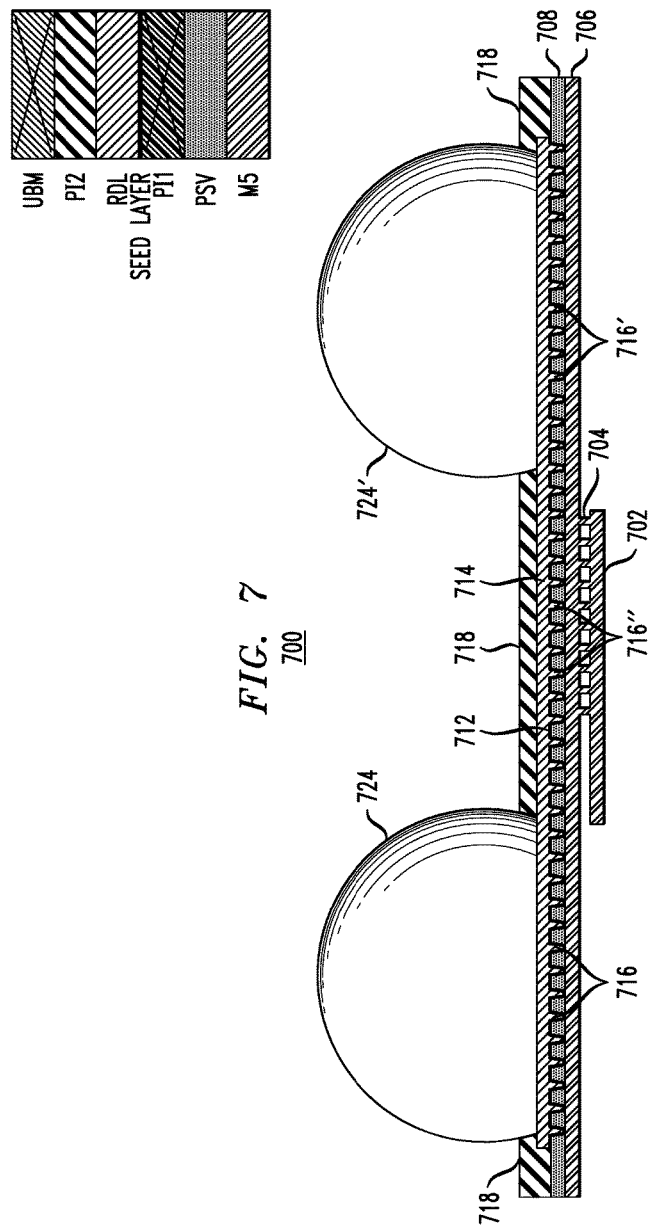

810

820

830

840

910

920

930

940

950

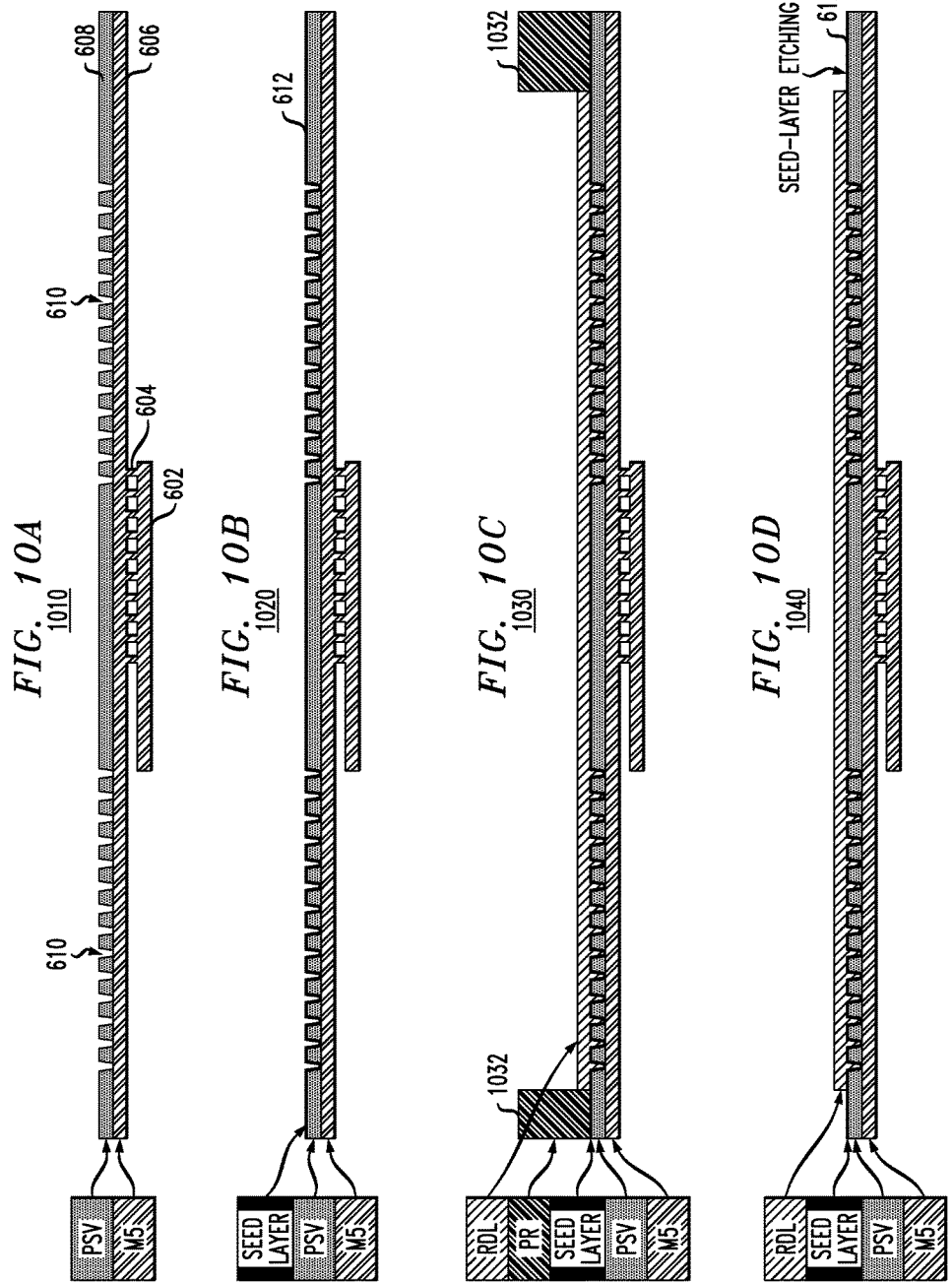

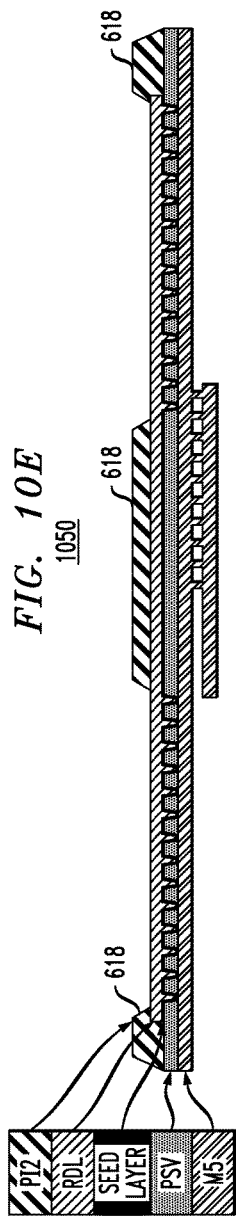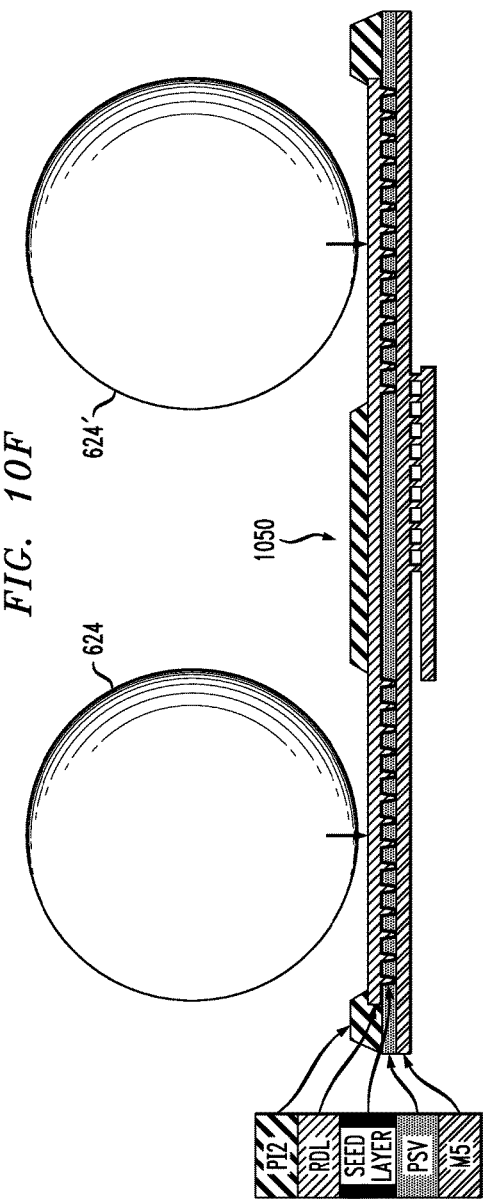

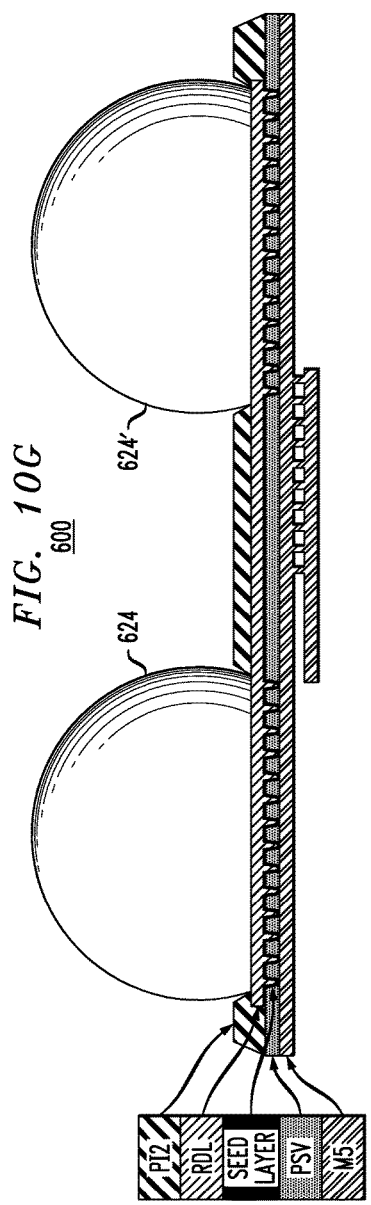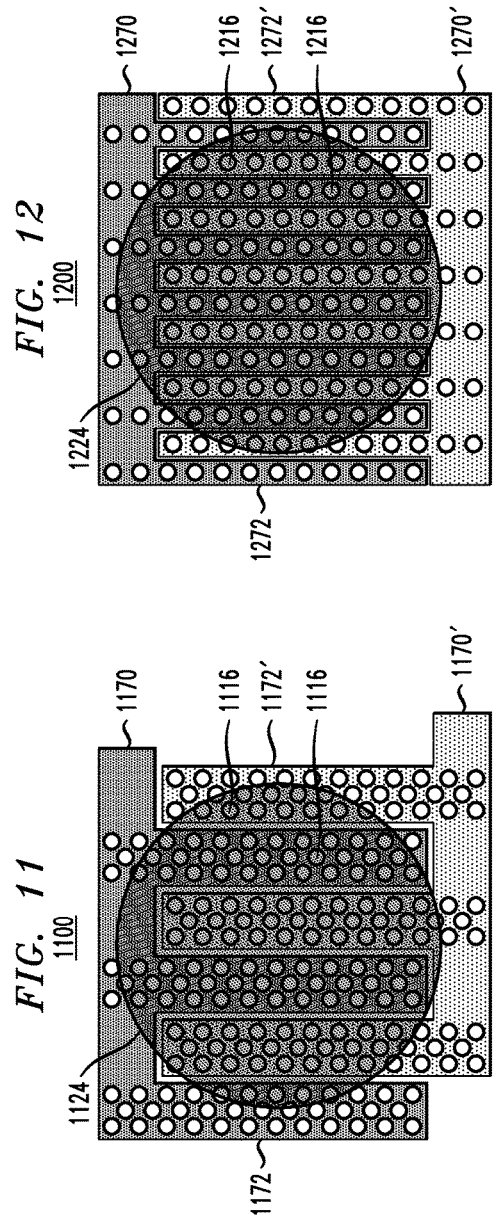

MULTI-VIA REDISTRIBUTION LAYER FOR INTEGRATED CIRCUITS HAVING SOLDER BALLS

BACKGROUND

The present invention relates generally to integrated circuit packaging, and, more particularly, to integrated circuits having solder balls, also known as solder bumps, used to connect the integrated circuits electrically to external electronic components.

FIG. 1A is a cross-sectional side view of a portion of a conventional integrated circuit (IC) 100, and FIG. 1B is a magnified view of a section 150 of the IC 100. FIG. 1A shows the top metal layer 106 (e.g., M5) of the IC 100 with vias 104 extending downwardly (i.e., perpendicularly to the metal layers) to the next lower metal layer 102 (e.g., M4). Although not represented in FIG. 1A, the IC 100 has other metal and non-metal layers below the metal layer 102. On top of the top metal layer 106 is a passivation (PSV) layer 108 having a number of openings 110 down to the top metal layer 106. On top of the PSV layer 108 and coating the side walls of the openings 110 is a first polyimide (PI1) dielectric layer 112. On top of the PI1 layer 112 and filling the remainder of each opening 110 down to the top metal layer 106 is a metal (e.g., copper) redistribution layer (RDL) 114. The portions of the RDL layer 114 that fill the openings 110 are via structures (a.k.a. vias) 116 that electrically connect the RDL layer 114 to the top metal layer 106.

As indicated in FIG. 1B, in order to accommodate a 7-micron thick PI1 layer 112, the bottom of each opening 110 in the PSV layer 108 is 40 microns wide in order to provide a metal via 116 having a bottom width of 26 microns.

On top of the RDL layer 114 is a second polyimide (PI2) dielectric layer 118 having a single, large opening 120. Filling the opening 120 in the PI2 layer 118 and extending beyond the opening 120 over a portion of the PI2 layer is under-ball metallization (UBM) 122. Lastly, on top of the UBM 122 is a solder ball 124.

One of the goals of the design of the IC 100 is to electrically connect the solder ball 124 and the top metal layer 106 with relatively low resistance (R-on) when the IC 100 is powered on. However, cracking can occur within the RDL layer 114 near the interface 160 between the solder ball 224 and the nearest via 116 due to stress and warpage of the RDL layer 114 resulting from repeated thermal expansion and contraction. Accordingly, it would be advantageous to have a low R-on bond pad design that is less susceptible to cracking due to stress and warpage.

BRIEF DESCRIPTION OF THE DRAWINGS

Embodiments of the invention will become more fully apparent from the following detailed description, the appended claims, and the accompanying drawings in which like reference numerals identify similar or identical elements.

FIG. 3 is a cross-sectional side view of a portion of the IC according to another inventive embodiment;

FIG. 4 is a cross-sectional side view of a portion of the IC according to another inventive embodiment;

FIG. 5 is a cross-sectional side view of a portion of the IC according to another inventive embodiment;

FIG. 7 is a cross-sectional side view of a portion of the IC according to another inventive embodiment;

FIGS. 10A-10G are cross-sectional side views illustrating a process flow for manufacturing the IC of FIG. 6A;

FIG. 11 is a top, X-ray view of a portion of an IC having a relatively large number of vias located under the footprint of a solder ball in accordance with the present invention; and FIG. 12 also is a top, X-ray view of a portion of an IC having a relatively large number of vias located under the footprint of a solder ball in accordance with the present invention.

DETAILED DESCRIPTION

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides an article of manufacture comprising an integrated circuit (IC). The IC comprises a top metal conducting layer, and a passivation layer on top of the top metal conducting layer. The passivation layer includes openings to the top metal conducting layer. A redistribution layer (RDL) is disposed on top of the passivation layer. Material of the RDL fills the openings in the passivation layer to form via structures that electrically connect the RDL to the top metal conducting layer. A solder ball is placed on top of the RDL. A footprint of the solder ball spans a first plurality of the via structures of the RDL such that electricity can flow vertically between the solder ball and the top metal conducting layer through the RDL and the first plurality of the via structures.

In another embodiment, the present invention provides a method for manufacturing a bonding pad of an IC having a top metal conducting layer. The method includes the step of applying a RDL on top of an IC sub-assembly having a passivation layer on top of the top metal conducting layer. The passivation layer has openings to the top metal conducting layer, and a material of the RDL fills the openings in the passivation layer to form via structures that electrically connect the RDL to the top metal conducting layer. The method also includes the step of placing a solder ball on top of the RDL, where a footprint of the solder ball spans a first plurality of the via structures such that electricity can flow vertically between the solder ball and the top metal conducting layer through the RDL and the first plurality of the via structures.

Figure 2A:
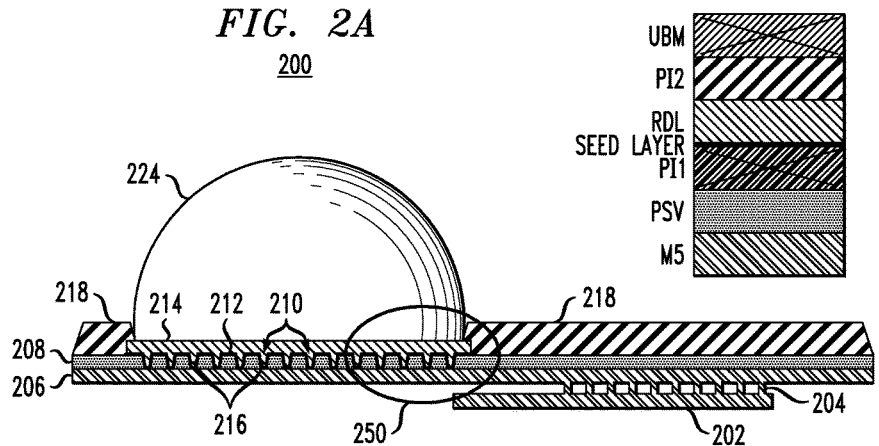
FIG. 2A is a cross-sectional side view of a portion of an IC according to one inventive embodiment.
Figure 2B:
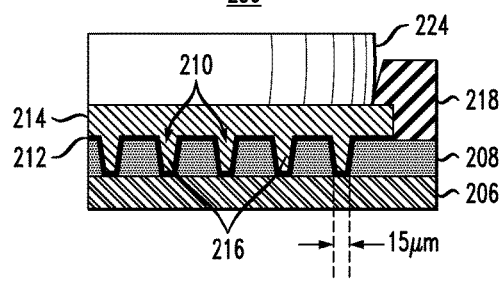
FIG. 2B is a magnified view of a section BX of the IC of FIG. 2A.
Figure 2C:
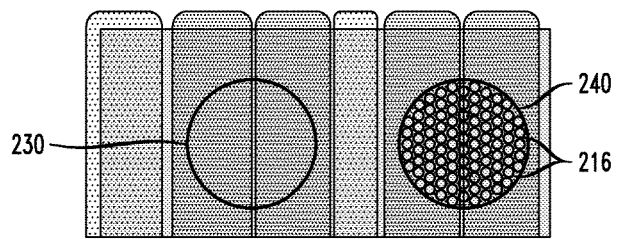
FIG. 2C is a top, X-ray view of a portion of the IC of FIG. 2A.

Referring now to FIG. 2A, a cross-sectional side view of a portion of an IC 200 according to one embodiment of the present invention is shown. FIG. 2B is a magnified view of a section 250 of the IC 200 of FIG. 2A, and FIG. 2C is a top, X-ray view of a portion of the IC 200 of FIG. 2A.

FIG. 2A shows the top metal layer 206 (e.g., M5) with vias 204 extending down (at least) to the next lower metal layer 202 (e.g., M4). Although not represented in FIG. 2A, the IC 200 has other metal and non-metal layers below the metal layer 202. On top of the top metal layer 206 is a passivation (PSV) layer 208 having a number of relatively small openings 210 down to the top metal layer 206. On top of the PSV layer 208 and filling the openings 210 in the PSV layer 208 down to the top metal layer 206 is a metal (e.g., copper) redistribution layer (RDL) 214 (e.g., about 4-8 microns thick). As shown in FIGS. 2A and 2B, the IC 200 has an optional, thin (e.g., about 0.3 micron thick) metal seed layer 212 on top of the PSV layer 208 and below the RDL layer 214. The seed layer 212 may be considered to be integral with the metal RDL layer 214. The portions of the RDL layer 214 that fill the openings 210 are vias 216 (also referred to as via structures) that electrically connect the RDL layer 214 to the top metal layer 206. Note that in the presently preferred embodiment, the IC 200 does not have a dielectric layer between the RDL layer 214 and the top metal layer 206 that is analogous to the PI1 layer 112 of the IC 100 of FIG. 1A.

Figure 1A:
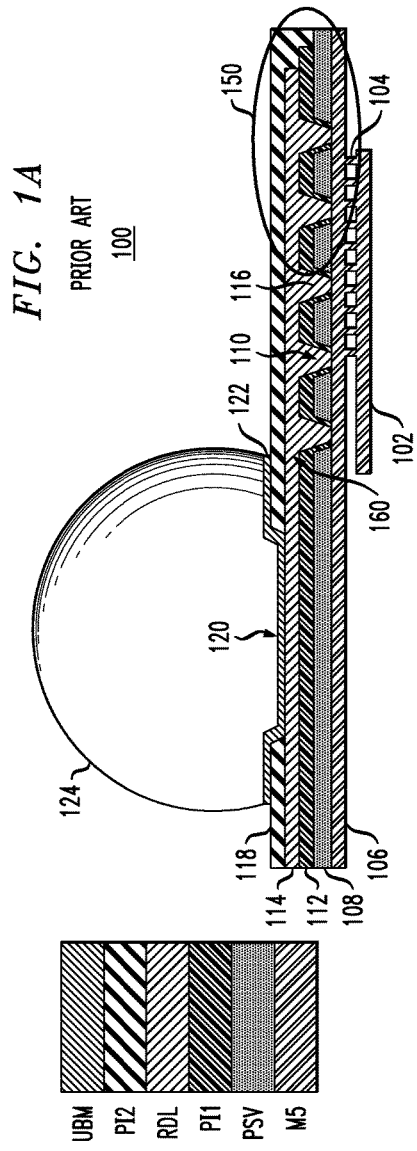
FIG. 1A is a cross-sectional side view of a portion of a conventional IC.
Figure 1B:
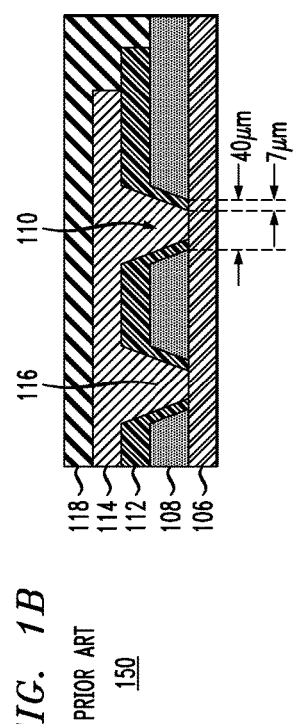
FIG. 1B is a magnified view of a section 150 of the IC of FIG. 1A.

On top of the RDL layer 214 is a polyimide (PI2) dielectric layer 218 having a single, large opening, where the PI2 layer 218 is somewhat analogous to the PI2 layer 118 of the IC 100 of FIG. 1A. Although the dielectric layer 218 is made of a polyimide, in other embodiments, suitable dielectric materials other than polyimides may be used. Filling the opening in the PI2 layer 218 is a solder ball 224. Note that the IC 200 does not have under-ball metallization (UBM) that is analogous to the UBM 122 of the IC 100 of FIG. 1A.

As indicated in FIG. 2B, each small tapered opening 210 in the PSV layer 208 is only about 15 microns wide at the bottom and only about 17 microns wide at the top. This small size of the openings 210 enables about 90-100 vias 216 to be configured below the circular footprint of the solder ball 224 having a diameter of about 260 microns. Thus, in one embodiment of the present invention, the first plurality comprises more than 40 via structures, in another embodiment, the first plurality comprises more than 60 via structures, and in yet another embodiment, the first plurality comprises more than 80 via structures. FIG. 2C represents the footprints of two instances of the solder ball 224: one footprint 230 represented with no vias and the other footprint 240 represented with 96 vias 216 below. Note that only about twenty 40-micron, medium-sized vias would be able to be configured below the footprint of the solder ball 224.

Unlike the medium-sized openings 110 in the PSV layer 108 of the IC 100 of FIG. 1A, the small openings 210 in the PSV layer 208 of the IC 200 are directly below the footprint of the solder ball 224, such that the footprint of the solder ball 224 spans the vias 216. In this way, the design of the IC 200 with its vias 216 directly below the solder ball 224, is more symmetrical than the design of the IC 100, which has its vias 116 located to one side of the solder ball 124. As a result of the more symmetrical design, the IC 200 will have lower stress and warpage due to thermal expansion than the IC 100 of FIGS. 1A and 1s therefore less susceptible to cracking in the RDL layer 214, while still providing low R-on resistance between the solder ball 224 and the top metal layer 206. Note that, in the IC 200, the RDL layer 214 does not have an interface between the solder ball 224 and the vias 216 that is analogous to the cracking-susceptible interface 160 of the IC 100 of FIG. 1A. In the presently preferred embodiment of the present invention, there is no UBM layer under the solder ball other than the RDL, there is no dielectric layer between the passivation layer and the RDL, and there is no dielectric layer between the RDL and the solder ball.

FIG. 3 is a cross-sectional side view of a portion of an IC 300 according to another embodiment of the present invention. The IC 300 is similar to the IC 200 of FIG. 2A with analogous elements having analogous labels, except that the IC 300 does not have a dielectric layer that is analogous to the PI2 layer of the IC 200.

FIG. 4 is a cross-sectional side view of a portion of an IC 400 according to yet another embodiment of the present invention. The IC 400 is similar to the IC 300 of FIG. 3 with analogous elements having analogous labels, except that the IC 400 has an RDL layer 414 that is thicker than the RDL layer 314 of the IC 300. The increased thickness of the RDL layer 414 compared to the RDL layer 314 of FIG. 3 may reduce dimpling on the surface of the RDL layer.

FIG. 5 is a cross-sectional side view of a portion of an IC 500 according to yet another embodiment of the present invention. The IC 500 is similar to the IC 200 of FIG. 2A with analogous elements having analogous labels, except that the RDL layer 514 of the IC 500 extends beyond the footprint of the solder ball 524 such that the IC 500 has additional vias 516' that are not configured directly below the footprint of the solder ball 524, i.e., the additional vias 516' are configured beyond the span of the solder ball's footprint. As a result of the increased total number of the vias 516 and 516', the R-on resistance level for the IC 500 can be even lower than that for the IC 200 of FIG. 2A. Thus, in at least some embodiments of the present invention, a second plurality of the via structures (e.g., vias 516') of the RDL are located beyond the footprint of the solder ball 524 such that current can flow vertically and horizontally between the solder ball and the top conducting layer through the RDL and the second plurality of the via structures.

Figure 6A:
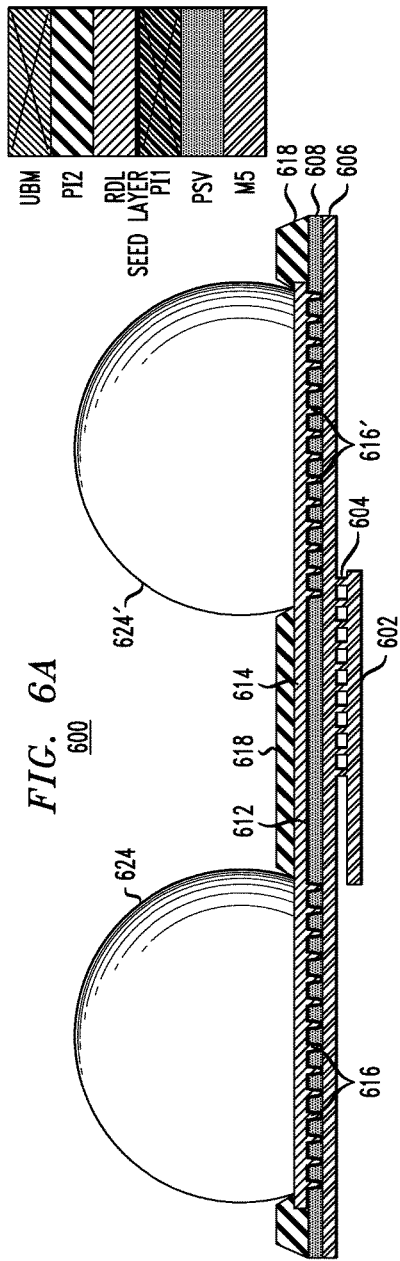
FIG. 6A is a cross-sectional side view of a portion of the IC according to another inventive embodiment.

FIG. 6A is a cross-sectional side view of a portion of an IC 600 according to yet another embodiment of the present invention. The IC 600 is similar to the IC 500 of FIG. 5 with analogous elements having analogous labels, except that the RDL layer 614 of the IC 600 extends to link with one (or more) other solder balls 624', which have additional vias 616' configured below the footprint(s) of the other solder ball(s) 624', thereby potentially achieving an even lower R-on resistance level for the IC 600 than that for the IC 500 of FIG. 5. Thus, in at least some embodiments of the present invention, the footprint of the at least one other solder ball 624' spans a second plurality of the via structures 616' of the RDL such that current can also flow vertically between the at least one other solder ball 624' and the top metal conducting layer through the RDL and the second plurality of the via structures 616'.

Figure 6B:
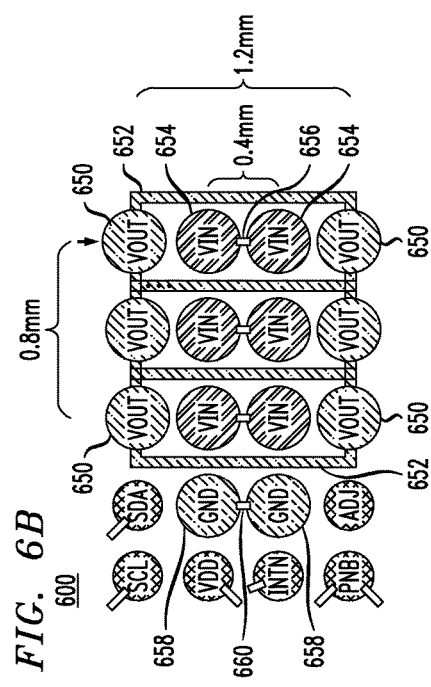
FIG. 6B is a top, X-ray view of a portion of the IC of FIG. 6A.

FIG. 6B is a top, X-ray view of a portion of the IC 600 of FIG. 6A representing the footprints of different subsets of solder balls, analogous to solder balls 624 and 624', interconnected by different RDL trace structures, as follows: (i) six footprints 650 interconnected by RDL trace structures 652 for six solder balls used for the IC output voltage VOUT; (ii) three pairs of footprints 654 interconnected by RDL trace structures 656 for six solder balls used for the IC input voltage VIN; and (iii) two footprints 658 interconnected by the RDL trace structure 660 for two solder balls used for the IC ground voltage GND.

FIG. 7 is a cross-sectional side view of a portion of an IC 700 according to yet another embodiment of the present invention. The IC 700 is similar to the IC 600 of FIG. 6A with analogous elements having analogous labels, except that the RDL layer 714 of the IC 700 has additional vias 716" positioned between the footprints of the two solder balls 724 and 724', thereby achieving an even lower R-on resistance level for the IC 700 than that for the IC 600 of FIG. 6A.

Figure 8A:
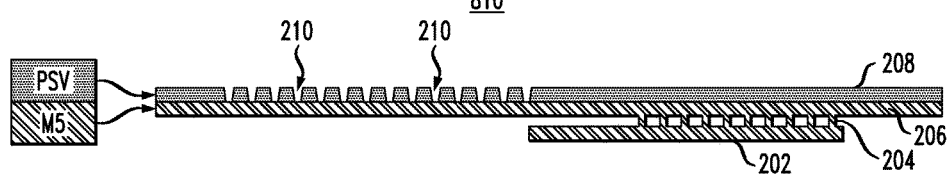
FIGS. 8A-8G are cross-sectional side views illustrating a process flow for manufacturing the IC of FIG. 2A.

FIGS. 8A-8G are cross-sectional side views illustrating a process flow for manufacturing the IC 200 of FIG. 2A. The illustrated process flow begins in FIG. 8A with the provision of the IC sub-assembly 810 having the upper metal layers 202 and 206 with intervening vias 204 and the superposed PSV layer 208. In some implementations, the IC sub-assembly 810 of FIG. 8A is manufactured at a wafer fabrication facility, while the rest of the processing of FIGS. 8B-8G is performed at a solder-ball bumping facility.

Figure 8B:
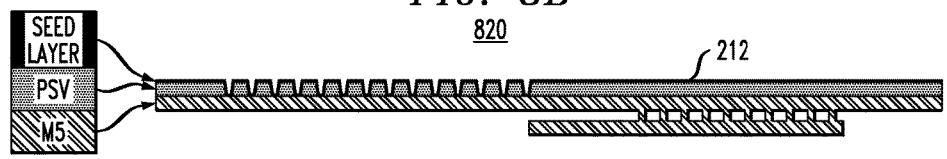

FIG. 8B illustrates the IC sub-assembly 820 that results from applying a metal seed layer 212 onto the sub-assembly 810 of FIG. 8A. Note that the seed layer 212 covers the PSV layer 208 including the sides of the openings 210 in the PSV layer 208 as well as the exposed regions of the top metal layer 206 at the bottoms of the openings 210. In alternative process flows, the application of the seed layer 212 may be omitted.

Figure 8C:
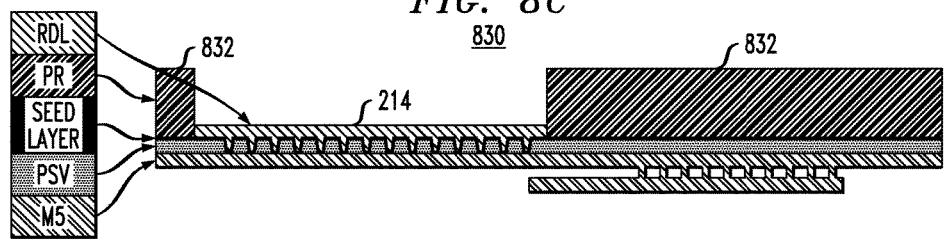

FIG. 8C illustrates the IC sub-assembly 830 that results from applying and photolithographically patterning a photoresist (PR) layer 832 and then applying the RDL layer 214 onto the sub-assembly 820 of FIG. 8B.

Figure 8D:
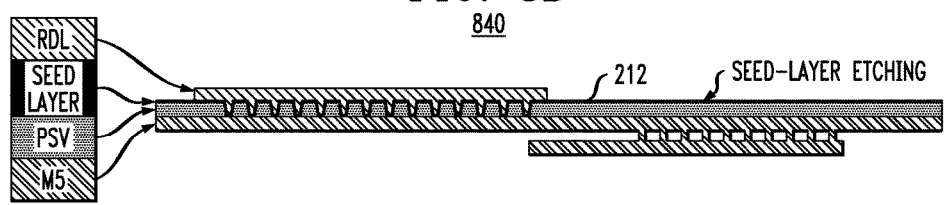

FIG. 8D illustrates the IC sub-assembly 840 that results from removing the PR layer 832 from the sub-assembly 830 of FIG. 8C.

Figure 8E:
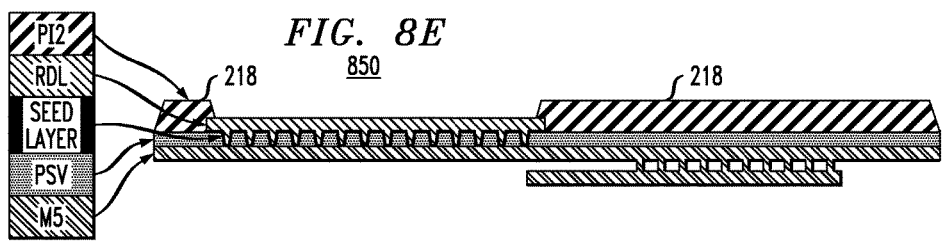

FIG. 8E illustrates the IC sub-assembly 850 that results from (i) etching away the exposed portions of the seed layer 212 from the IC sub-assembly 840 of FIG. 8D and then (ii) applying the PI2 layer 218 onto the resulting sub-assembly.

Figure 8F:
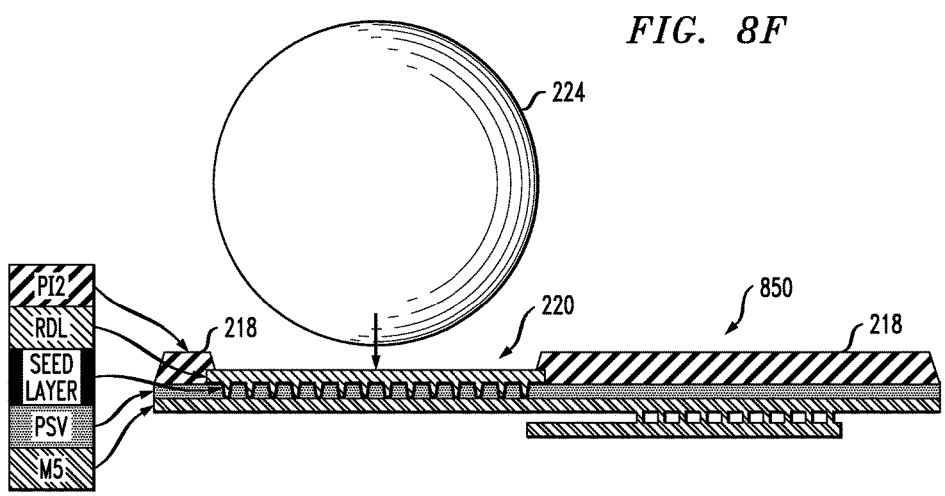

FIG. 8F illustrates the process of applying the solder ball 224 to the IC sub-assembly 850 of FIG. 8E. Note that the large opening 220 in the PI2 layer 218 identifies the position for the solder ball 224.

Figure 8G:
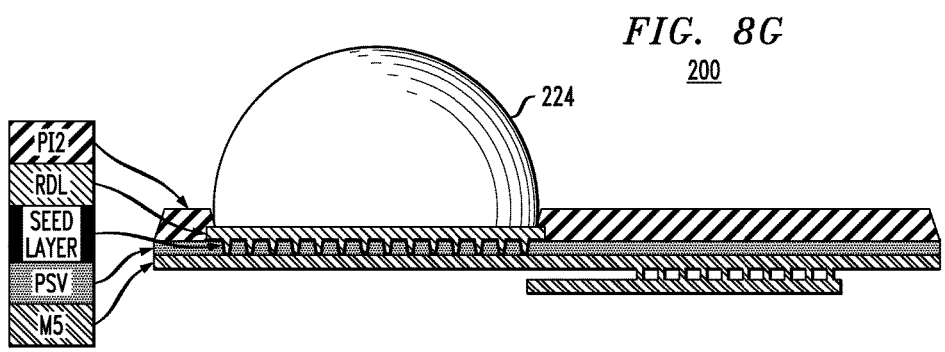

FIG. 8G illustrates the IC 200 of FIG. 2A that results from re-flowing the solder ball 224 of FIG. 8F.

FIGS. 9A-9F are cross-sectional side views illustrating a process flow for manufacturing the IC 300 of FIG. 3. The process flow of FIGS. 9A-9D is similar to the process flow of FIGS. 8A-8D with analogous elements having analogous labels.

Because the IC 300 of FIG. 3 does not have a dielectric layer that is analogous to the PI2 layer 218 of FIG. 2A, the process flow for the IC 300 does not have a step analogous to that of FIG. 8E for the IC 200 of FIG. 2A. Instead the process flow for the IC 300 proceeds to FIG. 9E, which represents the IC sub-assembly 950 that results from applying the solder ball 324 to the IC sub-assembly 940 of FIG. 9D.

Figure 9A:
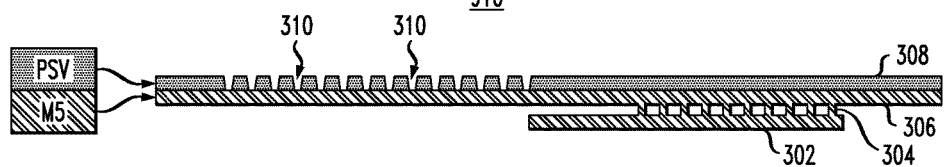
FIGS. 9A-9F are cross-sectional side views illustrating a process flow for manufacturing the IC of FIG. 3.
Figure 9B:
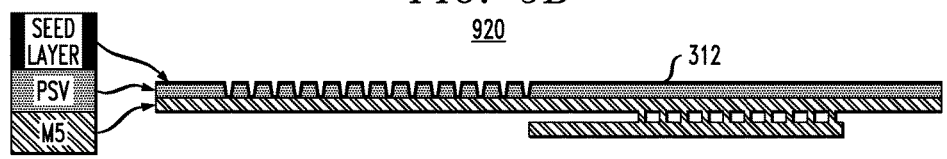
Figure 9C:
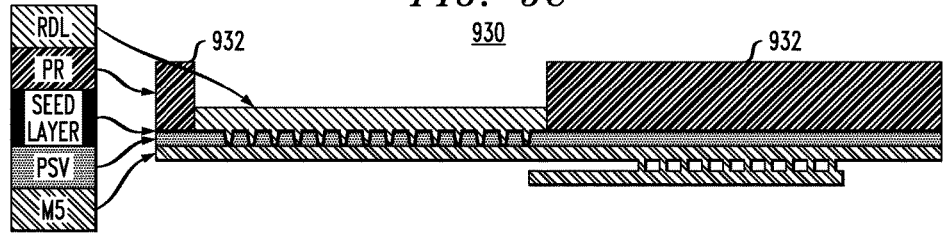
Figure 9D:
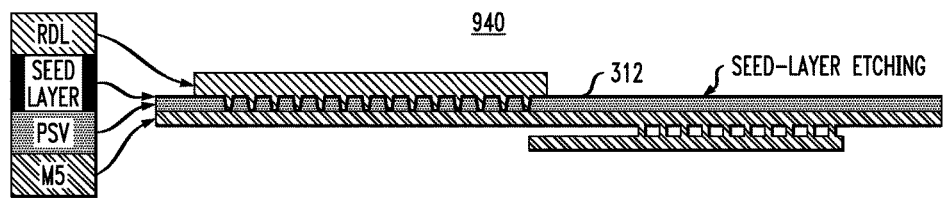
Figure 9E:
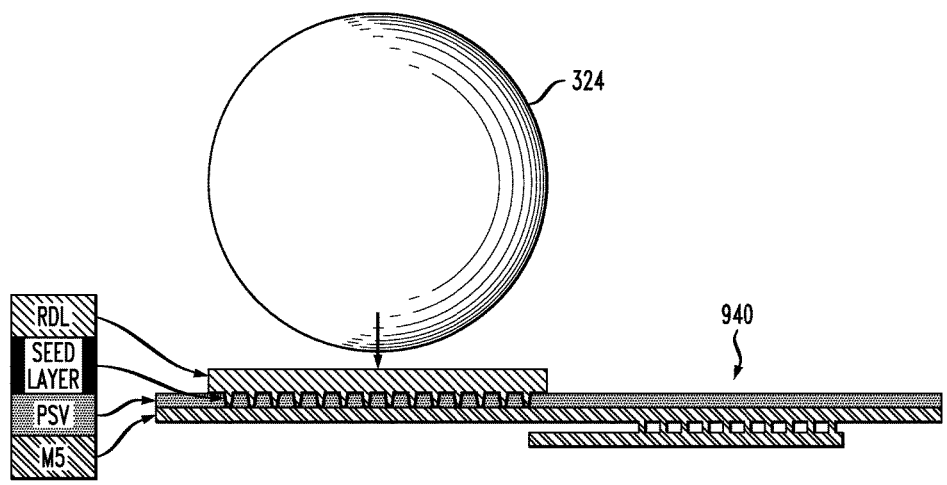
Figure 9F:
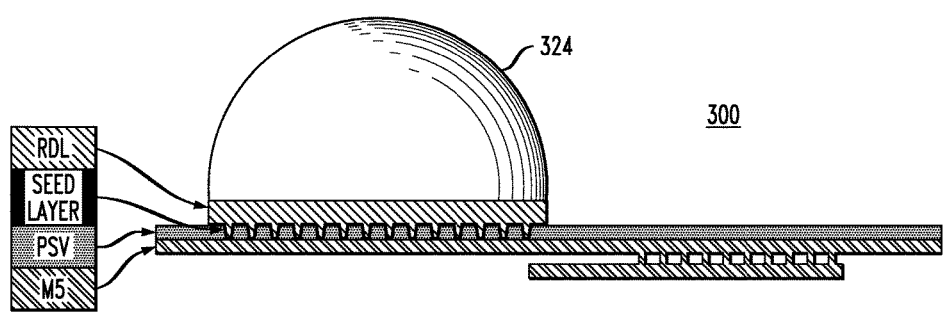

FIG. 9F illustrates the IC 300 of FIG. 3 that results from re-flowing the solder ball 324 of FIG. 9E.

FIGS. 10A-10G are cross-sectional side views illustrating a process flow for manufacturing the IC 600 of FIG. 6A. The process flow of FIGS. 10A-10G is similar to the process flow of FIGS. 8A-8G with analogous elements having analogous labels, except that the RDL layer 614 is different and two solder balls 624 and 624' are applied instead of only one.

Those skilled in the art will understand how to manufacture other inventive embodiments, include those not explicitly shown in the drawings.

FIG. 11 is a top, X-ray view of a portion of an IC 1100 having a relatively large number of vias 1116 located under the footprint of the solder ball 1124, where the vias 1116 are connected to two different RDL trace structures 1170 and 1170' in the RDL layer, where the structures 1170 and 1170' have multiple, interleaved RDL arms 1172 and 1172', each RDL arm 1172/1172' connected to three offset columns of vias 1116.

FIG. 12 is a top, X-ray view of a portion of an IC 1200 having a relatively large number of vias 1216 located under the footprint of the solder ball 1224, where the vias 1216 are connected to two different RDL trace structures 1270 and 1270' in the RDL layer, where the structures 1270 and 1270' have multiple, interleaved RDL arms 1272 and 1272', each RDL arm 1272/1272' connected to a single column of vias 1216.

Those skilled in the art will understand that the inventive embodiments shown in the drawings are not the only possible embodiments for the present invention. For example, the number and sizes of the vias and/or the number and sizes of the interconnected solder balls may vary.

Although not limited in this way, the invention is particularly useful in Wafer-Level Chip-Scale Packaging (WLCSP) technology. WLCSP refers to the technology of packaging an integrated circuit at the wafer level, instead of the traditional process of assembling individual units in packages after dicing them from a wafer. In final form, a WLCSP device is an integrated circuit die with an array pattern of solder balls/bumps attached at an I/O pitch that is compatible with traditional circuit board assembly processes. WLCSP is a true chip-scale packaging (CSP) technology, since the resulting package is of the same size of the die. WLCSP technology differs from other ball-grid array (BGA) and laminate-based CSPs in that no bond wires or interposer connections are required.

Although the invention has been described in the context of certain structures identified as being made of metal, in other implementations, conducting materials other than metal may be used for some or all of those structures. As such, the "top conducting layer" recited in the claims may be a conventional top metal layer or a top die layer made of some other suitably conducting material.

As used herein, the term "solder ball" includes ball/bump structures made of solder as well as functionally equivalent ball/bump structures made of materials other than conventional solder.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An article of manufacture comprising an integrated circuit (IC), the IC comprising:
   a top metal conducting layer;
   a passivation layer on top of the top metal conducting layer, wherein the passivation layer comprises openings to the top conducting layer;
   a redistribution layer on top of the passivation layer, wherein material of the redistribution layer fills the openings in the passivation layer to form via structures electrically connecting the redistribution layer to the top metal conducting layer; and
   a solder ball placed on top of the redistribution layer that has a footprint that spans a first plurality of the via structures of the redistribution layer such that electricity can flow vertically between the solder ball and the top metal conducting layer through the redistribution layer and the first plurality of the via structures,
   wherein there is no under-bump metallization (UBM) layer under the solder ball other than the redistribution layer, and
   wherein the solder ball is in direct contact with the redistribution layer, and the footprint of the solder ball is vertically aligned with the first plurality of the via structures over the top metal conducting layer.

2. The article of claim 1, wherein a second plurality of the via structures of the redistribution layer are located outside of the footprint of the solder ball such that electricity can also flow vertically and horizontally between the solder ball and the top conducting layer through the redistribution layer and the second plurality of the via structures.

3. The article of claim 1, wherein there is no dielectric layer between the passivation layer and the redistribution layer.

4. The article of claim 1, wherein there is no dielectric layer between the passivation layer and the redistribution layer.

5. The article of claim 1, wherein there is no dielectric layer between the redistribution layer and the solder ball.

6. The article of claim 1, wherein the first plurality comprise more than 40 via structures.

7. The article of claim 1, wherein the article is a wafer-level chip-scale package (WLCSP).

8. The article of claim 3, wherein there is no dielectric layer between the redistribution layer and the solder ball.

9. The article of claim 6, wherein the first plurality comprise more than 60 via structures.

10. The article of claim 9, wherein the first plurality comprise more than 80 via structures.

11. An article of manufacture comprising an integrated circuit (IC), the IC comprising:
    a top metal conducting layer;
    a passivation layer on top of the top conducting layer, wherein the passivation layer comprises openings to the top conducting layer;
    a redistribution layer on top of the passivation layer, wherein material of the redistribution layer fills the openings in the passivation layer to form via structures electrically connecting the redistribution layer to the top conducting layer; and
    a solder ball placed on top of the redistribution layer that has a footprint that spans a first plurality of the via structures of the redistribution layer such that electricity can flow vertically between the solder ball and the top conducting layer through the redistribution layer and the first plurality of the via structures, and
    wherein the redistribution layer electrically connects the solder ball to at least one other solder ball.

12. The article of claim 11, wherein a footprint of the at least one other solder ball spans a second plurality of the via structures of the redistribution layer such that electricity can also flow vertically between the at least one other solder ball and the top conducting layer through the redistribution layer and the second plurality of the via structures.

13. The article of claim 12, wherein a third plurality of the via structures of the redistribution layer extend beyond the footprints of the solder ball and the at least one other solder ball such that electricity can also flow horizontally and vertically between at least one of the solder balls and the top conducting layer through the redistribution layer and the third plurality of the via structures.

14. A method for manufacturing a bonding pad of an integrated circuit (IC) having a top metal conducting layer, the method comprising:
    applying a redistribution layer on top of an IC sub-assembly having a passivation layer on top of the top metal conducting layer, wherein:
       the passivation layer comprises openings to the top metal conducting layer; and
       material of the redistribution layer fills the openings in the passivation layer to form via structures electrically connecting the redistribution layer to the top metal conducting layer;
    applying a first solder ball on top of the redistribution layer, wherein a footprint of the first solder ball spans a first plurality of the via structures of the redistribution layer such that electricity can flow vertically between the first solder ball and the top metal conducting layer through the redistribution layer and the first plurality of the via structures; and
    applying a second solder ball on top of the redistribution layer, wherein the redistribution layer electrically connects the first solder ball to the second solder ball.

15. The method of claim 14, wherein a footprint of the second solder ball spans a second plurality of the via structures of the redistribution layer such that electricity can flow vertically between the second solder ball and the top conducting layer through the redistribution layer and the second plurality of the via structures.

16. The method of claim 15, wherein a third plurality of the via structures of the redistribution layer extend beyond the footprints of the first and second solder balls, such that electricity can flow horizontally and vertically between at least one of the first and second solder balls and the top conducting layer through the redistribution layer and the third plurality of the via structures.

* * * * *